(12) United States Patent
Wang

(10) Patent No.: US 7,753,824 B2
(45) Date of Patent: Jul. 13, 2010

(54) FINGER-TOUCH TYPE SENSOR FOR AN EXERCISE APPARATUS

(76) Inventor: Leao Wang, No. 1, Lane 233, Sec. 2, Charng Long Rd., Taiping (TW) 411

( * ) Notice: Subject to any disclaimer, the term of this patent is extended or adjusted under 35 U.S.C. 154(b) by 0 days.

(21) Appl. No.: 11/890,253

(22) Filed: Aug. 6, 2007

(65) Prior Publication Data

US 2009/0042696 A1 Feb. 12, 2009

(51) Int. Cl.
*A63B 24/00* (2006.01)
(52) U.S. Cl. .......................................... 482/4
(58) Field of Classification Search ............... 482/1–9, 482/55–57, 54, 52, 70, 79
See application file for complete search history.

(56) References Cited

U.S. PATENT DOCUMENTS

| | | | |
|---|---|---|---|
| 6,682,461 B2 * | 1/2004 | Wang et al. .................... 482/54 |
| 6,808,473 B2 * | 10/2004 | Hisano et al. .................. 482/8 |
| 7,267,636 B2 * | 9/2007 | Wang et al. .................... 482/52 |
| 7,354,383 B2 * | 4/2008 | Bardha .......................... 482/82 |
| 2002/0016235 A1 * | 2/2002 | Ashby et al. .................... 482/8 |
| 2002/0055418 A1 * | 5/2002 | Pyles et al. .................... 482/8 |
| 2002/0055419 A1 * | 5/2002 | Hinnebusch .................... 482/8 |
| 2003/0069108 A1 * | 4/2003 | Kaiserman et al. ............. 482/8 |
| 2005/0209052 A1 * | 9/2005 | Ashby et al. .................... 482/9 |
| 2006/0046905 A1 * | 3/2006 | Doody et al. .................. 482/57 |
| 2007/0100214 A1 * | 5/2007 | Steinert ....................... 600/300 |
| 2007/0102280 A1 * | 5/2007 | Hunter et al. ........... 204/157.15 |
| 2007/0201727 A1 * | 8/2007 | Birrell et al. ................ 382/115 |
| 2007/0254270 A1 * | 11/2007 | Hersh .......................... 434/236 |
| 2007/0254778 A1 * | 11/2007 | Ashby ............................ 482/5 |
| 2008/0007418 A1 * | 1/2008 | Maki et al. ................ 340/686.6 |
| 2008/0032864 A1 * | 2/2008 | Hakki ............................ 482/8 |
| 2008/0051256 A1 * | 2/2008 | Ashby et al. .................... 482/5 |

* cited by examiner

Primary Examiner—Lori Baker

(57) ABSTRACT

A finger-touch sensor for an exercise apparatus, comprising at least a detection recess formed at a handrail (or a swing arm) of the exercise apparatus for insertion of a human finger. At least one block-out short-wave sensor having an emitter and a corresponding receiver is fitted to the detection recess. The block-out short-wave sensor is coupled through a wire transmission line to an electronic console of the exercise apparatus such that an actual detection message obtained by the block-out short-wave sensor may conduct a pre-determined action by use of a built-in microprocessor. In this way, an easy control and adjustment of all factors (such as the exercise speed, slope or resistance, etc.) of the exercise apparatus is ensured by placing the human finger into the detection recess for blocking the emitting or reflecting signal.

3 Claims, 2 Drawing Sheets

FINGER-TOUCH TYPE SENSOR FOR AN EXERCISE APPARATUS

BACKGROUND OF THE INVENTION

1. Fields of the Invention

The present invention relates to a finger-touch type sensor for an exercise apparatus, and more particularly to a sensor which is activated by a single finger of an operator such that an easy control and adjustment of every exercise factor of the exercise apparatus is achieved.

2. Description of the Related Art

The inventor of the present invention has filed two patent applications, one is "method for controlling an electric treadmill" (published in U.S. Pat. No. 6,682,461) and the other is "structure of rocker arms with optical sensing control for an exercise apparatus" (application Ser. No. 11/079,545). The first disclosure includes at least one sensing unit at the position of the handrail such that an air sensing range is created. As a result, a practical activation is achieved by swinging the palm within the air sensing range.

The first disclosure is really a progressive and practical innovation for the electric treadmill with stationary handrails and is favored by consumers in all countries. However, the structure in accordance with the first disclosure has problem in operation or application to other apparatuses when the exercise apparatus is fitted with movable handrails that can be held by both hands of the operator and movable therewith. This is because the air sensing range should not be changed at any time during the operation. Accordingly, the application of the first disclosure is restricted to some extent.

In order to eliminate the above-mentioned drawbacks, the invention developed the second disclosure that includes an optical sensing unit having similar effect for the exercise apparatus with movable handrails. In this way, the light source can be blocked out by only one finger of the operator for effectively achieving the expected operation and control effects.

The second disclosure can really fulfill the operation and control effects and is suitable for all exercise apparatuses with either stationary or movable handrails. However, the photo-sensors (such as photoresistors, etc.) are extremely sensitive. The action will take place only when the light source is exactly and carefully blocked during the operation. It is impractical particularly for operators with less patience.

SUMMARY OF THE INVENTION

In view of the shortcomings of the prior art, the inventor of the present invention based on years of experience in the related industry to conduct extensive researches and experiments, and finally invented and developed a finger-touch type sensor for an exercise apparatus having the similar operation and control effects to the above-mentioned disclosures. According to the invention, a short-wave sensor is provided with an emitter and a receiver in match with an electronic console having a microprocessor. In this way, an actual detection message obtained by the sensor may conduct a pre-determined action, thereby combining the advantages of the above-mentioned two disclosures and eliminating the potential disadvantages thereof in operation and application. As a result, the operator can have more alternatives according to his own preference in operation and control.

Therefore, it is a primary object of the invention to provide a finger-touch type sensor for an exercise apparatus comprising at least a detection recess formed at a handrail of the exercise apparatus for insertion of a human finger. At least one block-out type short-wave sensor having an emitter and a corresponding receiver is fitted to the detection recess. The block-out type short-wave sensor is coupled through a wire transmission line to an electronic console of the exercise apparatus such that an actual detection message obtained by the block-out type short-wave sensor may conduct a pre-determined action by use of a built-in microprocessor.

BRIEF DESCRIPTION OF THE DRAWINGS

The accomplishment of this and other objects of the invention will become apparent from the following description and its accompanying drawings of which.

DETAILED DESCRIPTION OF THE PREFERRED EMBODIMENT

The present invention will now be described in more detail hereinafter with reference to the accompanying drawings that show various embodiments of the invention.

Figure 1:
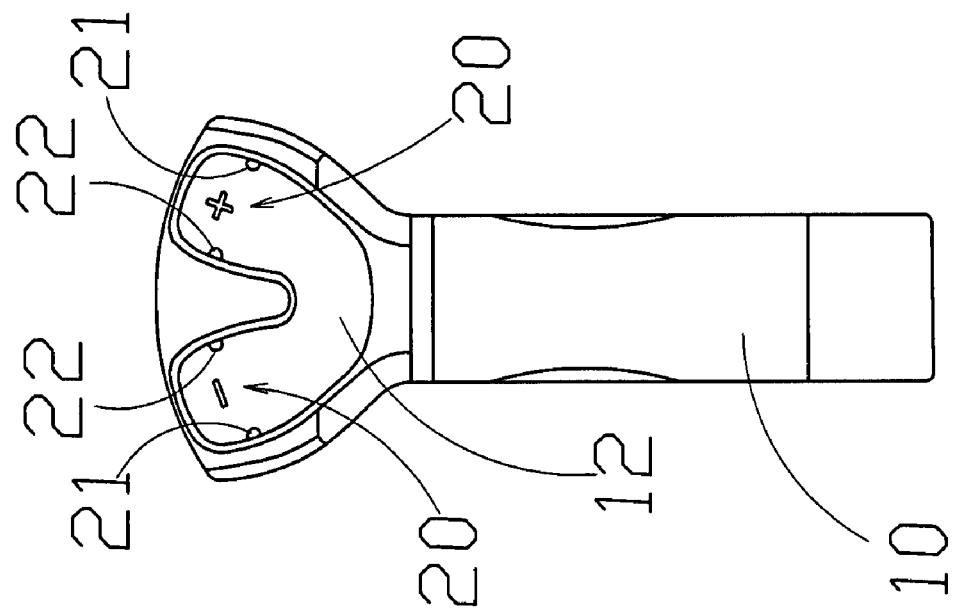
FIG. 1 is a schematic view of a preferred embodiment of the present invention of the block-out type.
Figure 2:
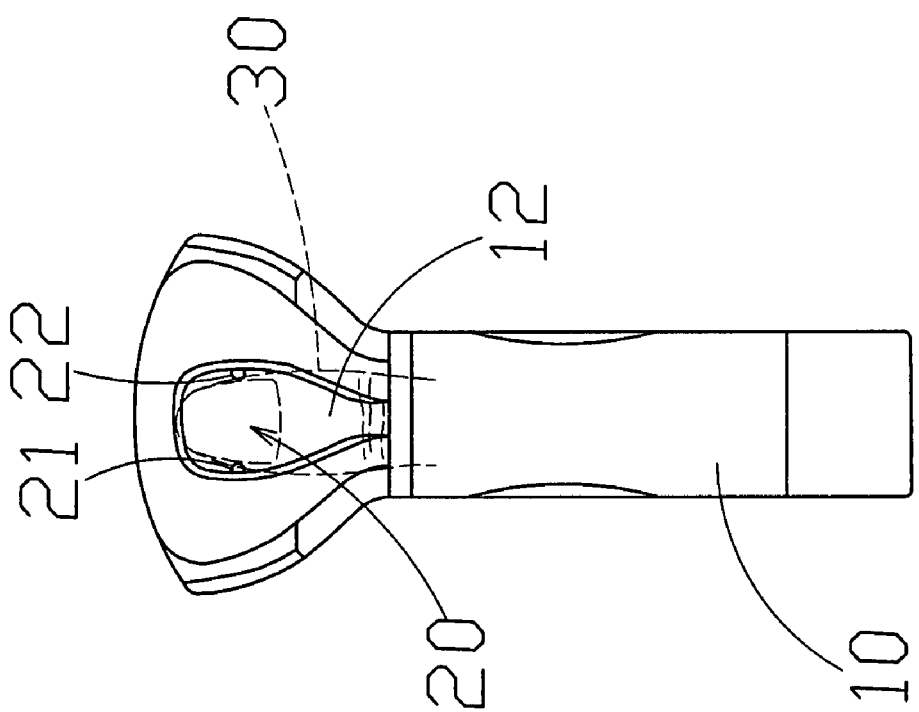
FIG. 2 is a schematic view of another embodiment of the present invention of the block-out type.

Firstly, referring to FIGS. 1 and 2, two preferred embodiments of the invention in match of a block-out type short-wave sensor 20 are illustrated. It is apparent from the drawings that a detection recess 12 is formed at any handrail 10 (or swing arm) of an exercise apparatus (not shown) for insertion of a human finger 30. At least one block-out type short-wave sensor 20 having an emitter 21 and a corresponding receiver 22 is fitted to the detection recess 12. The block-out type short-wave sensor 20 is coupled through a wire transmission line (not shown) to an electronic console (not shown) of the exercise apparatus. In this way, an actual detection message obtained by the block-out type short-wave sensor 20 may conduct a pre-determined action by use of a built-in microprocessor (not shown). Accordingly, an easy control and adjustment of the exercise factors (such as the exercise speed, slop or resistance, etc.) of the exercise apparatus is achieved by placing the human finger 30 into the detection recess 12 for blocking the emitting signal (that is, a full-time block-out of the receiving state of the receiver 22).

Based upon the above-mentioned configuration, the block-out type short-wave sensor 20 can be employed to control the rotation speed of a motor (not shown) of an exercise apparatus. As shown in FIG. 1, the block-out type short-wave sensor 20 in the handrail 10 at one side of the exercise apparatus can be used to control the acceleration action while the block-out type short-wave sensor 20 in the handrail 10 at the other side of the exercise apparatus can be used to control the deceleration action. As shown in FIG. 2, two block-out type short-wave sensors 20 are fitted to the handrail 10 at a single side allowing for the control of the acceleration and deceleration actions. Meanwhile, the handrail 10 at the other side can be employed to adjust the slope or the resistance.

Figure 4:
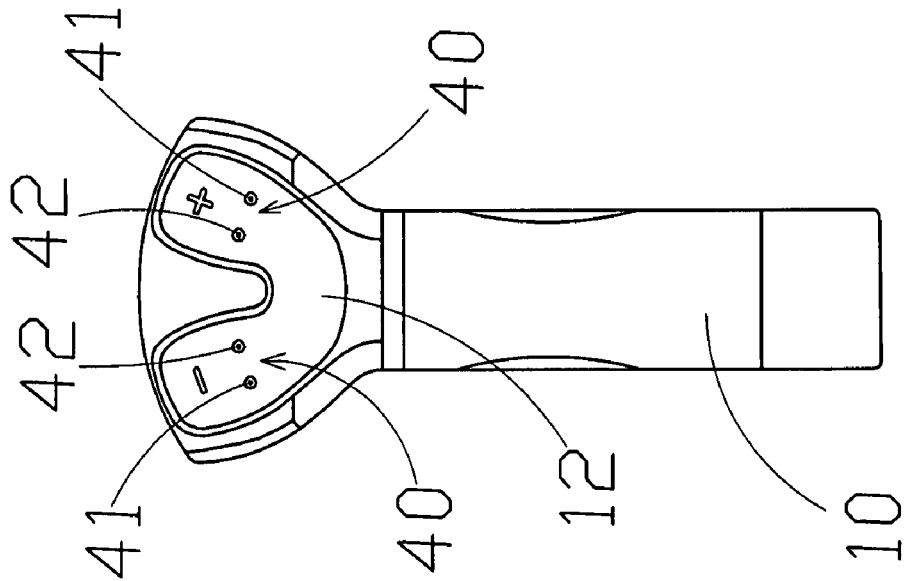
FIG. 4 is a schematic view of another embodiment of the present invention of the reflection type.
Figure 3:
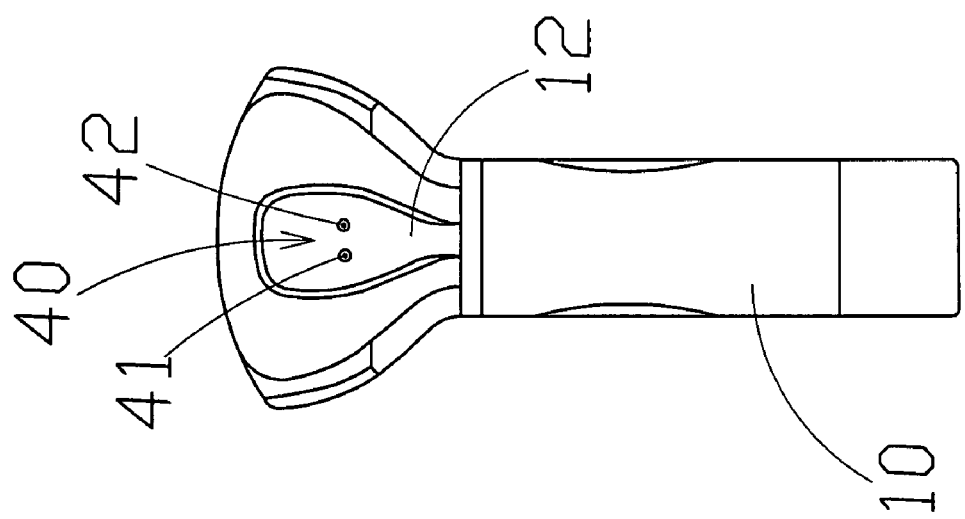
FIG. 3 is a schematic view of a preferred embodiment of the present invention of the reflection type.

Referring to FIGS. 3 and 4, two preferred embodiments of the invention in match of a reflection type short-wave sensor 40 are illustrated. The detection and operation principles of the reflection type short-wave sensor 40 correspond to those of the block-out type short-wave sensor 20. However, the human finger 30 is used to reflect the signal emitted by an emitter 41 to a receiver 42. Likewise, the same expected effect and action can be achieved as well.

The function of the block-out type short-wave sensor 20 or the reflection type short-wave sensor 40 can also be achieved by any detection type electronic technique such as infrared, ultraviolet ray, ultrasound, laser wave, high frequency, low frequency, sound wave, light wave, etc.

The reason why the invention employs the "short-wave" sensor 20 lies in that the detection range is limited within the detection recess 12 of the handrail 10. As a result, an unnecessary interference caused by a too large detection range is avoided Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A finger-touch sensor for an exercise apparatus, comprising:

one detection recess being formed at a handrail of the exercise apparatus for insertion of a user's finger; and at least one short-wave sensor having an emitter and a corresponding receiver being fitted to the one detection recess, wherein the short-wave sensor is configured to transmit to a built-in microprocessor in an electronic console of the exercise apparatus, wherein the short-wave sensor is further configured for a user to both increase and decrease an exercise factor of the exercise apparatus by placing the user's finger into the one detection recess and moving the user's finger within the one detection recess to selectively block the emitting or reflecting signal.

2. The finger-touch sensor for an exercise apparatus as recited in claim 1, wherein the short-wave sensor is selected from a group consisting of a block-out short-wave sensor and a reflection short-wave sensor.

3. The finger-touch sensor for an exercise apparatus as recited in claim 1, wherein the exercise factor is selected from the group consisting of exercise speed, exercise slope, and exercise resistance.

* * * * *